United States Patent
Hildebrant (10) Patent No.: US 7,181,663 B2
(45) Date of Patent: Feb. 20, 2007

(54) WIRELESS NO-TOUCH TESTING OF INTEGRATED CIRCUITS

(75) Inventor: Andrew S. Hildebrant, Loveland, CO (US)

(73) Assignee: Verigy Pte, Ltd., Singapore (SG)

(*) Notice: Subject to any disclaimer, the term of this patent is extended or adjusted under 35 U.S.C. 154(b) by 379 days.

(21) Appl. No.: 10/790,906

(22) Filed: Mar. 1, 2004

(65) Prior Publication Data

US 2005/0193294 A1    Sep. 1, 2005

(51) Int. Cl.
*G01R 31/28* (2006.01)
*G06F 11/00* (2006.01)

(52) U.S. Cl. ........................... 714/726; 714/30

(58) Field of Classification Search ............ None
See application file for complete search history.

(56) References Cited

U.S. PATENT DOCUMENTS

| | | | |
|---|---|---|---|
| 6,112,067 A * | 8/2000 | Seike et al. ............... | 455/226.4 |
| 6,189,120 B1 * | 2/2001 | Akram ........................ | 714/724 |
| 6,412,086 B1 * | 6/2002 | Friedman et al. ........... | 714/733 |
| 6,807,644 B2 * | 10/2004 | Reis et al. ................... | 714/724 |

* cited by examiner

*Primary Examiner*—Christine T. Tu (57) ABSTRACT

A wireless integrated circuit test method and system is presented. The invention allows testing of one or more integrated circuits configured with a wireless interface and a test access mechanism which controls input of test data received over a wireless connection from a test station to test structures which test functional blocks on the integrated circuit. Via the wireless connection, multiple integrated circuits or similarly equipped devices under test can be tested simultaneously. The invention also enables concurrent testing of independently testable functional blocks on any given integrated circuit under test.

13 Claims, 6 Drawing Sheets

WIRELESS NO-TOUCH TESTING OF INTEGRATED CIRCUITS

BACKGROUND OF THE INVENTION

Integrated circuit testing is critical at both the design level to confirm proper operation of a given design and at the manufacturing level for ensuring a given chip meets all manufacturing specifications prior to shipment. However, as the cost of integrated circuit fabrication continues to fall, the cost of integrated circuit testing has increased. One reason for increasing test costs is based on the increasing ratio of number of transistors to number of implementable pads on an integrated circuit. For example, the ratio of the number of transistors to number of pads increased from 2,500 in 1990 to 300,000 in 2001. Undoubtedly, this trend for smaller and smaller integrated circuits with increasing transistor density will continue. The increasing trend to integrate greater capability into IC's, resulting in embedded complexities, has significantly reduced the effectiveness of the present in-circuit testing methods at the board level via a "bed of nails" interface. Due to the physical limitations of external test probes in terms of required size and spacing, the number of external pads is likely to decrease rather than increase, and will certainly not keep up with the rate of increase in number of integrated circuit transistors.

Accordingly, alternative solutions to current integrated circuit test techniques are continually being sought. The most popular trends in improving testability of integrated circuits include Design for Test (DFT) and Concurrent Test (CCT) techniques. DFT techniques are general design procedures, practices and rules that fit or link circuit testability to the development of manufacturing environments. DFT requires the addition of specialized test hardware on the integrated circuit itself that is independent of the blocks implementing the intended functionality of the integrated circuit. Traditional DFT techniques include Scan Techniques (for example, using the IEEE 1149.1 Boundary Scan and Joint Test Access Standard (JTAG) protocols), Built In Self Test (BIST), and IDDQ tests.

CCT techniques allow independent and concurrent testing (i.e., testing in parallel) of independent functional blocks on the integrated circuit. CCT techniques rely on partitioning the functionality of the overall intended integrated circuit functionality into independently testable functional blocks during the design phase. For example, there is an increasing trend to building System-on-a-Chip (SOC) integrated circuits which are devices made up of multiple independent cores that each provide specific independent functionality. The SOC cores are often supplied by various third parties, and are "stitched" together with customized "glue" logic to meet the overall design goals of the particular SOC. SOCs are prime candidates for implementing DFT and CCT testing techniques.

During testing, the integrated circuit is placed into a test mode that is different from its normal operating mode. When in test mode, test data is routed to the functional blocks under the control of the DFT specialized test hardware rather than from external integrated circuit pads (i.e., the DFT hardware replaces the I/O pins for data/address/control I/O signals). The DFT hardware applies test data to the block under test, and receives return results. Analysis of the result data may be performed by the DFT hardware, or may be output to an external tester device for off-line analysis.

DFT hardware is typically designed to reduce the number of full functional test channels (and therefore physical test probes) required for test access. This is achieved using various techniques. In Scan testing, a scan storage cell is implemented for each input and output of interest of the block under test. The scan storage cells are connected together in a serial chain, which is connected at an input to the integrated circuit's scan-in port and connected at an output to the integrated circuits scan-out port. Test data is loaded into the scan chains via a serial scan load operation, for example using the IEEE 1149.1 Boundary Scan and JTAG protocols, incorporated herein by reference for all that it teaches. The scan storage cells are multiplexed with the data path used during normal operation of the integrated circuit such that when the integrated circuit is placed in test mode, data is applied to the inputs and outputs of interest of the block under test from respective scan storage cells, and when the integrated circuit is placed in normal operating mode, data is applied to the inputs and outputs of the block under test via the normal data path (typically from an I/O pin or an I/O signal from another functional block on the integrated circuit). In the standard JTAG protocol, data is loaded into the scan chains via a Test Data In (TDI) serial input pin, and data is output from the scan chains via a Test Data Out (TDO) serial output pin. Accordingly, access to any number of I/O ports within the integrated circuit is made available via only four test pins (TDI, TDO, TCK (i.e., Test Clock, for receiving a clock signal used to step the TAP controller state machine and to serially load/unload data), and TMS (i.e., Test Mode Select, for allowing command control of the JTAG circuitry).

Another technique that may be used independent of or along with Scan techniques is known as Built In Functional Test, or BIST. BIST includes hardware that allows the integrated circuit to test itself. BIST hardware typically includes test pattern generators (TPGs), output response analyzers (ORAs), and/or microdiagnostic routines. There are several types of BIST, including on-line BIST that refers to testing that occurs during normal functional operating conditions (i.e., the integrated circuit is not placed into a test mode), generic off-line BIST where testing occurs when the integrated circuit is placed into test mode, functional off-line BIST which deals with the execution of a test based on a functional description of the block under test, and structural off-line BIST that refers to testing in order to detect structural faults.

Yet another technique that may be used independent of or along with Scan techniques and/or BIST is data compression, such as X-Mode. In this technique, test data input to the DFT structures is compressed and results are compressed prior to sending them to the outside world.

In each of the above techniques, the focus is on reducing test access pin count. However, because data must be applied serially to the integrated circuit, it increases test time, and therefore test cost.

Concurrent testing (CCT) and compression techniques assist in reducing test time. As described above, CCT allows multiple independent functional blocks to be tested in parallel, and compression techniques reduce the volume of data to be transferred to and from the integrated circuit under test.

However, in each of the above techniques, the cost of test is still high because currently, expensive "bed-of-nails" testers are still used to probe the test access points on the integrated circuits under test. In each of the above-described techniques, the integrated circuit designs typically feature centralized or decentralized Test Access Mechanisms (TAM) through which data passes. In a traditional DFT test, these TAMs receive test data from chip pins or pads connected directly to tester resources.

Figure 1:
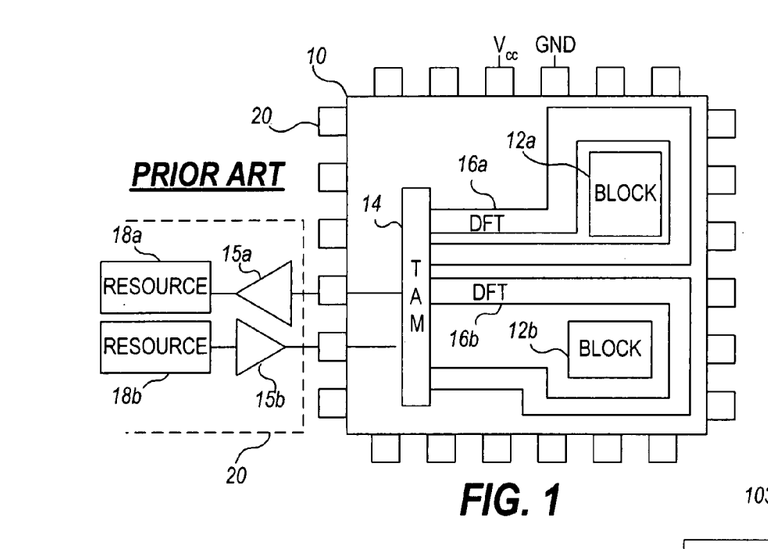
FIG. 1 is a block diagram illustrating an integrated circuit chip employing DFT techniques.

FIG. 1 illustrates a simplified example of an integrated circuit chip 10 employing DFT techniques. The chip 10 includes one or more digital blocks 12a, 12b, each having associated DFT hardware 16a, 16b that facilitates testing of the digital blocks 12a, 12b, and a Test Access Mechanism (TAM) 14. The TAM 14 receives test data via integrated circuit chip pins 15a, 15b that are connected directly to tester resources 18a, 18b in a traditional "bed-of-nails" tester 20.

DFT techniques suffer from several common limitations. One typical difficulty is that DFT often requires a large amount of memory for storing test data. While BIST overcomes this problem by including test pattern generators for generating predictable patterns of test data without storing it, standard BIST techniques are typically covered by BIST intellectual property, which can be expensive to purchase and uses precious space on the chip.

Ideally, wafer, package, subsystem and system level DFT approaches should entail structures that provide a means for testing at critical locations within the integrated circuits, PC boards and systems. Pertinent data feedback over the life of the product to all levels of the process would enhance continuous improvement and project future requirements amidst increasing complexities.

Accordingly, it would be desirable to overcome the problems of the prior art described above, by providing an integrated circuit testing technique that reduces the required integrated circuit test pin/pad count, decreases test time, and is economical.

SUMMARY OF THE INVENTION

The present invention is a method and apparatus for testing integrated circuits over a wireless communication channel that minimizes the required integrated circuit test pin/pad count, decreases test time, and is economical. The technique of the invention allows testing of an integrated circuit with minimal physical probe contact (i.e., without requiring the use of a dedicated integrated circuit tester), and further allows testing during multiple phases of the life cycle of the integrated circuit. In addition, the invention may be adapted to allow testing of multiple integrated circuits of the same design in parallel.

To achieve the above named advantages and still others not enumerated, the present invention utilizes a wireless interface to download test data and upload test results from an integrated circuit implementing one or more DFT structures. To this end, during design of an integrated circuit to be tested, the integrated circuit is provided with a wireless interface such as a wireless Internet Protocol (IP) core implementing a standard TCP/IP stack. The integrated circuit is also provided with one or more DFT structures that test one or more functional blocks on the integrated circuit. During power up, initialization, reset, and/or when placed in a special test mode, the wireless IP core is tested for functionality. If the wireless IP core is determined functional, the wireless IP core is used to load test data to the DFT structures and to upload test results from the DFT structures. In the preferred embodiment, test data is downloaded from and test results are uploaded to a personal computer, or other entity that need not have the full functionality of a full-blown printed circuit board tester.

Since many Application Specific Integrated Circuits (ASICs) being tested include a wireless IP core as part of the intended functionality of the chip, these chips are most easily adaptable to the invention since the wireless IP core is required functionality of the chip and DFT structures would likely be implemented regardless of the method of application of the test data to the chip.

The advantages attendant with the present invention are numerous. Once the wireless IP core is validated (through an analog test, a handshake communication test with the wireless test station, or selftest), it can serve as a limitless conduit of digital data. In test mode, the wireless core is connected to the chip's DFT structures via a test control port or other routing mechanism. Data can then be transmitted from a test station such as a personal computer to the integrated circuit without connecting any digital tester resources to the device under test (DUT). Results data can be sent back to the tester in the same way. Therefore, far fewer digital test resources must be connected to the perimeter of the device. In the ideal case, only power and ground must be supplied. All other validation data and DFT test control instructions are supplied through the wireless connection. Therefore, other than power and ground, no physical connection to the integrated circuit is required.

In addition, standard wireless Internet protocols such as IEEE 802.11 Wireless WLAN and 801.15 Wireless WPAN protocols such as Bluetooth allow communication with multiple wireless devices at the same time. Accordingly, the test station can be configured to handshake with the wireless IP core of multiple integrated circuits under test and then begin sending and receiving test data to all the devices simultaneously. This technique enables a massively parallel testing approach using common PC hardware, resulting in immediate cost-reduction impacts.

The present invention may also be used to test integrated circuits that are designed for CCT. Test data throughput is typically limited by internal serial scan chain load/unload frequency of about 20 MHz. Standard wireless IP protocols can run at significantly higher speeds, and transport data in packaged units called frames containing varying numbers of bytes, words, or blocks. The data is recovered frame by frame; thus each frame is released from the wireless protocol stack (e.g., TCP/IP) only when the entire frame is present, or essentially in parallel. Accordingly, each bit in the bytes, words, or blocks of the frame can be treated as a separate channel and assigned to drive a separate scan chain or other internal port in the device. Accordingly, multiple scan chains can be loaded in parallel, thereby increasing the speed of loading the chains, and ultimately decreasing the time for testing the device. Similarly, data from multiple output ports can be recovered in parallel, formatted into frames, and returned to the test station via standard IP protocols.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 2A:
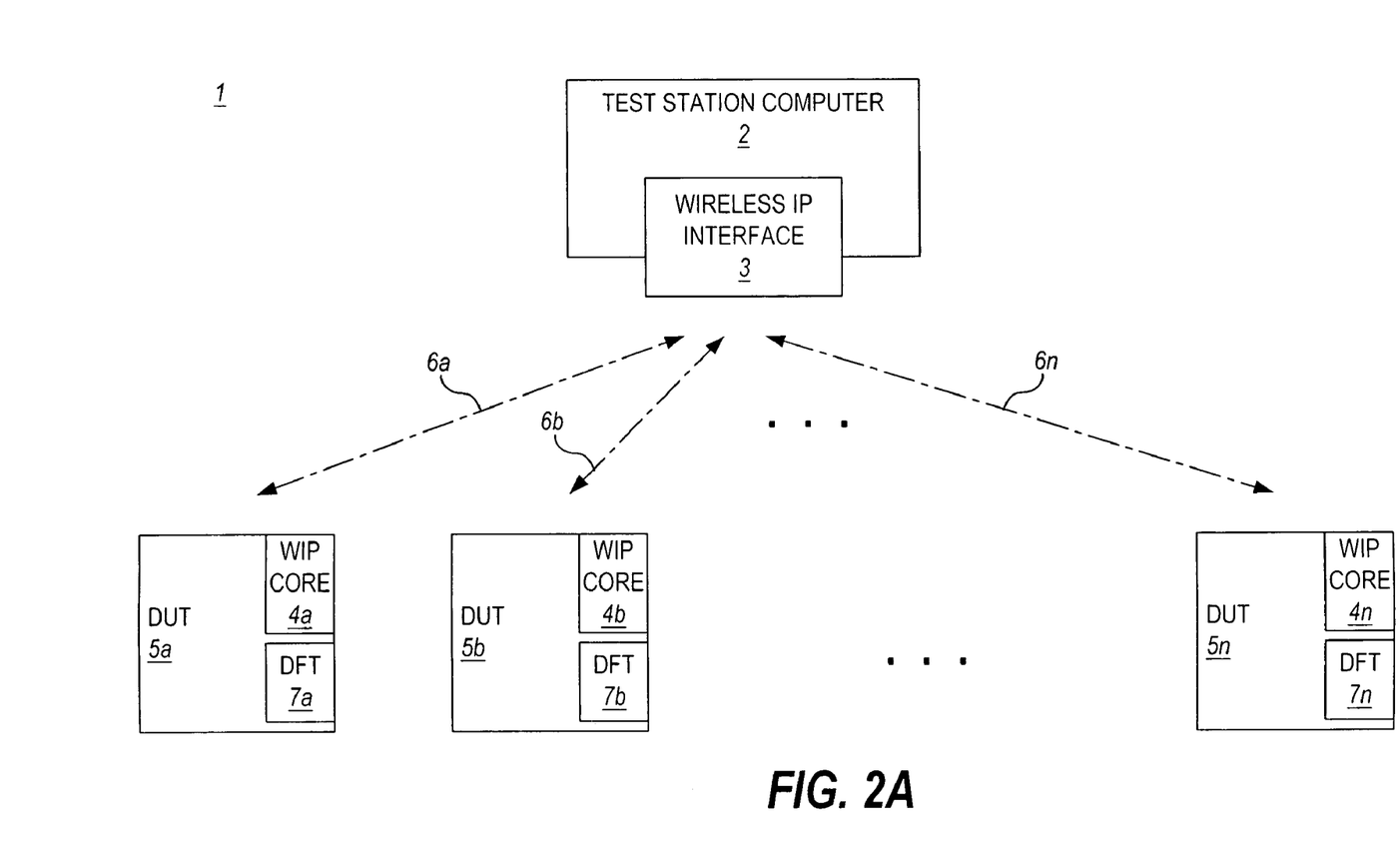
FIG. 2A is a high-level system block diagram of an integrated circuit test system implemented in accordance with the invention.
Figure 2B:
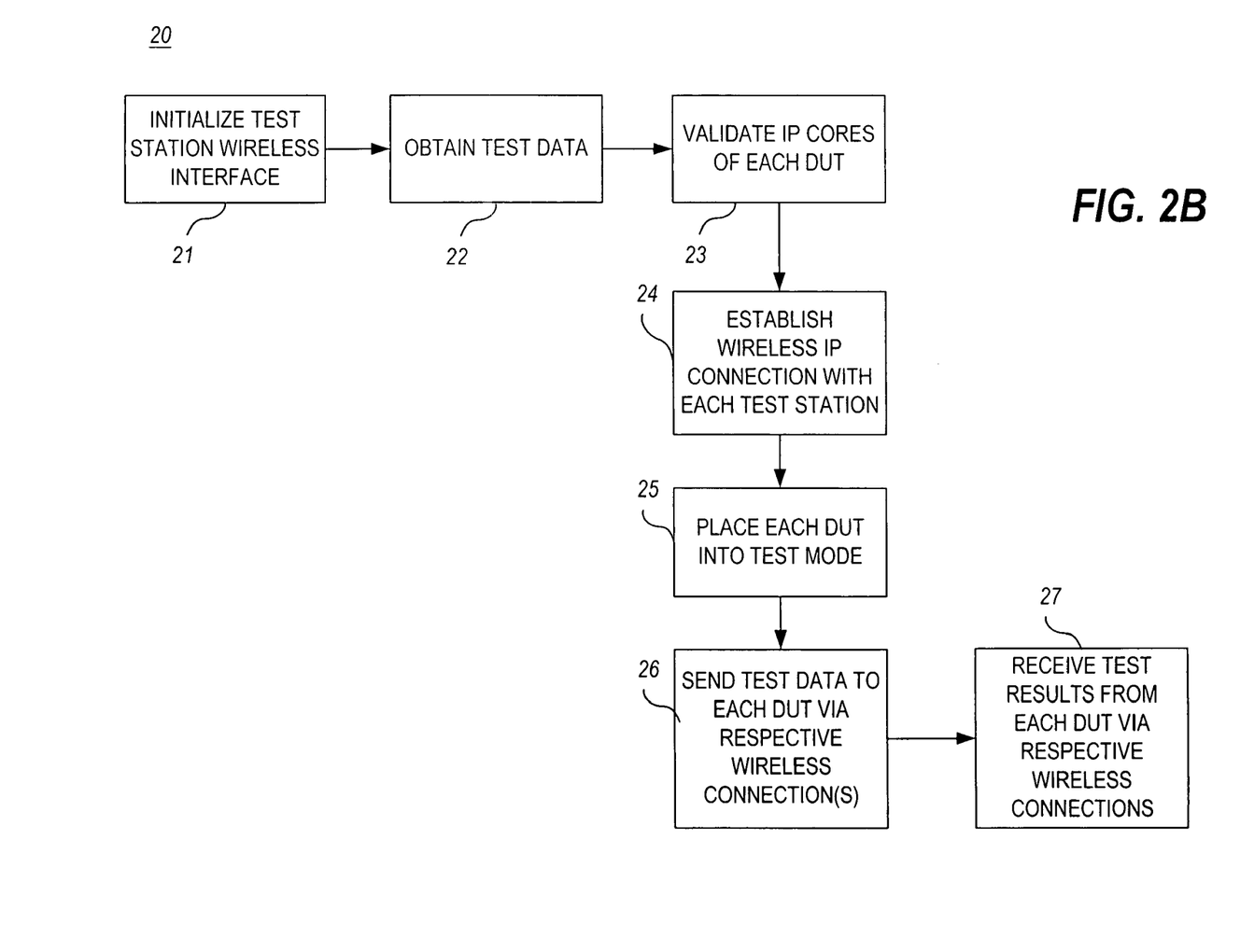
FIG. 2B is a flowchart of an exemplary embodiment for testing one or more devices under test using the wireless testing interface of the invention.

Turning now to the drawings, FIG. 2A is a high-level system diagram, and FIG. 2B is an operational flowchart, of an integrated circuit test system 1 illustrating the general concept of the invention. As illustrated, according to the present invention, a single test station computer 2 equipped with a wireless internet protocol interface 1 is configured to communicate with one or more devices under test (DUTs) 5a, 5b, . . . , 5n equipped with wireless IP cores 4a, 4b, . . . , 4n over a wireless IP connection 6a, 6b, 6c. The wireless IP cores 4a, 4b, . . . , 4n are connected to or are connectable to DFT structures 7a, 7b, . . . , 7n that are configured to test various functional blocks (not shown) within the respective DUTs 5a, 5b, . . . , 5n. The DUTs 5a, 5b, 5n may be integrated circuit wafers, packaged integrated chips, printed circuit boards, etc., as long as they include some form of Design-For-Test functionality that requires digital test data.

The test station 2 sends test data, for use by the DFTs 7a, 7b, . . . , 7n, to the DUTs 5a, 5b, . . . , 5n over the wireless IP connections 6a, 6b, . . . , 6n. The DFTs 7a, 7b, . . . , 7n execute tests using the test data and return results to the test station via the wireless connection 6a, 6b, . . . , 6n.

Because many wireless IP protocols support simultaneous transmission of data to multiple IP addresses, multiple DUTs 5a, 5b, . . . , 5n may receive the wireless signal simultaneously, allowing multiple DUTs 5a, 5b, . . . , 5n may be tested in parallel.

Figure 3:
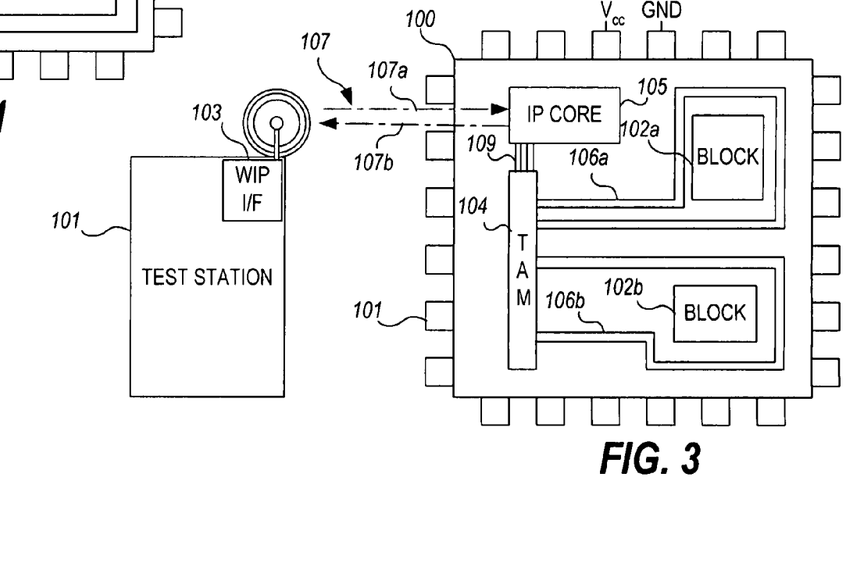
FIG. 3 is a schematic block diagram of a simple design of an integrated circuit chip implemented according to the invention.

FIG. 3 is a schematic block diagram of a simple design of an integrated circuit chip 100 implemented according to the invention. As illustrated therein, the chip 100 includes one or more digital blocks 102a, 102b, each having associated DFT hardware 106a, 106b (for example scan wrappers) that facilitates testing of the digital blocks 102a, 102b. The chip 100 also includes a Test Access Mechanism (TAM) 104 for routing test data to the DFT structures, and a wireless Internet protocol (WIP) core 105. The WIP core 105 is connected to (or connectable to) the TAM 104 during test mode. The TAM 104 receives test data 107a via the WIP core 105 from a test station (i.e., a remote computer) 101 configured with a wireless interface 103 over a wireless IP connection 107.

Figure 4:
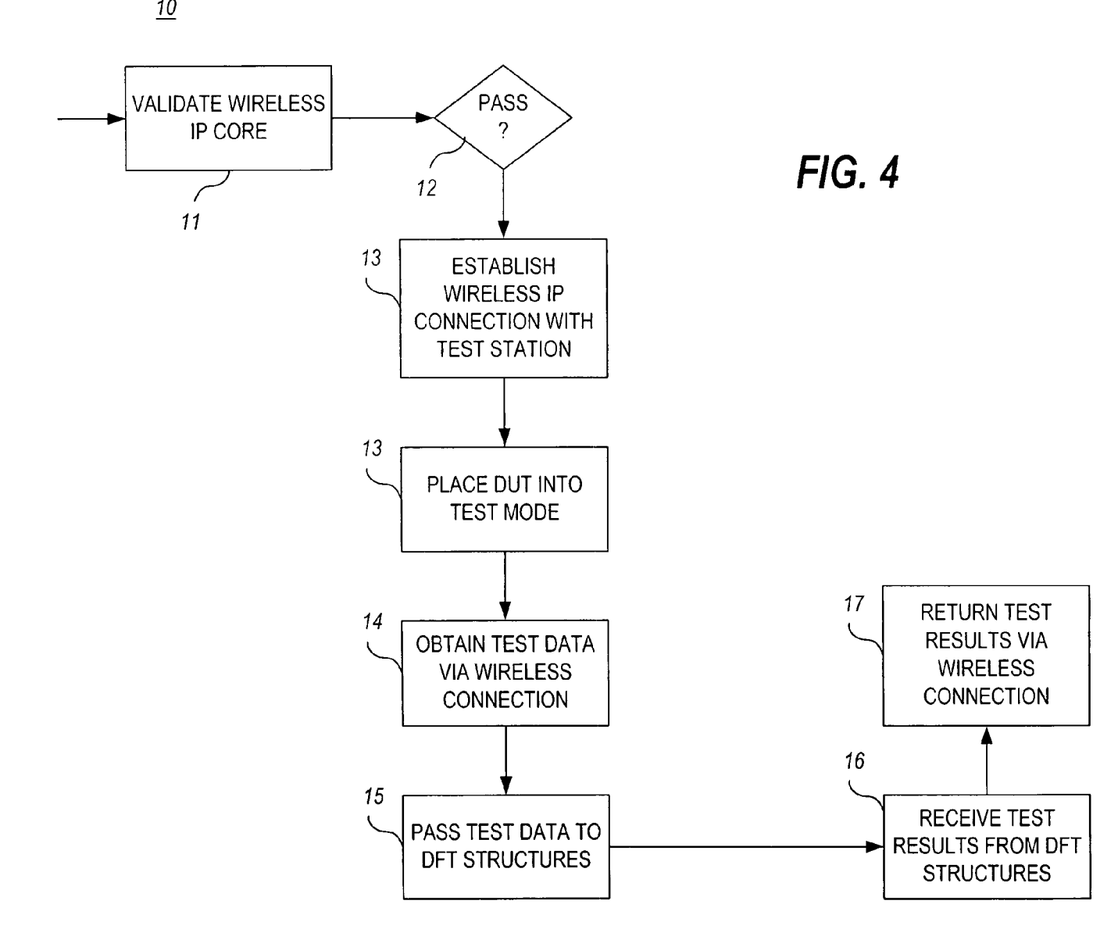
FIG. 4 is a flowchart illustrating operation of the system according to the invention.

FIG. 4 is a flowchart illustrating operation 10 of the system according to the invention. In operation, at power up, initialization, reset, and/or when placed in a special test mode, the wireless IP core 105 of the chip 100 is validated (step 11) through some sort of test (e.g., an analog test, a wireless handshake with the test station 101, or some sort of BIST). If the validation test determines (step 12) that the wireless IP core 105 is non-functional, the validation test fails. If the validation test determines (step 12) that the wireless IP core 105 is functional, a wireless IP connection is established (step 13) with the test station 101, and the wireless IP core 105 may then serve as a limitless conduit of digital data between the test station 101 and chip 100.

To test the chip 100, the chip 100 is placed into a test mode (step 14). In the preferred embodiment, the WIP core 105 is connected to the TAM 104 which includes capability for differentiating between instructions and data. The wireless IP core 105 of the chip 100 obtains test data from the test station 101 via the wireless IP connection 107 (step 15). The wireless IP core 105 passes the received test data 107 to the DFT structures 106a, 106b (via the TAM 104). Test results returned from the DFT structures 106a, 106b are received (step 17) by the wireless IP core 105 and the results 107b are returned (step 18) to the test station 101 via the wireless IP connection 107.

Figure 5:
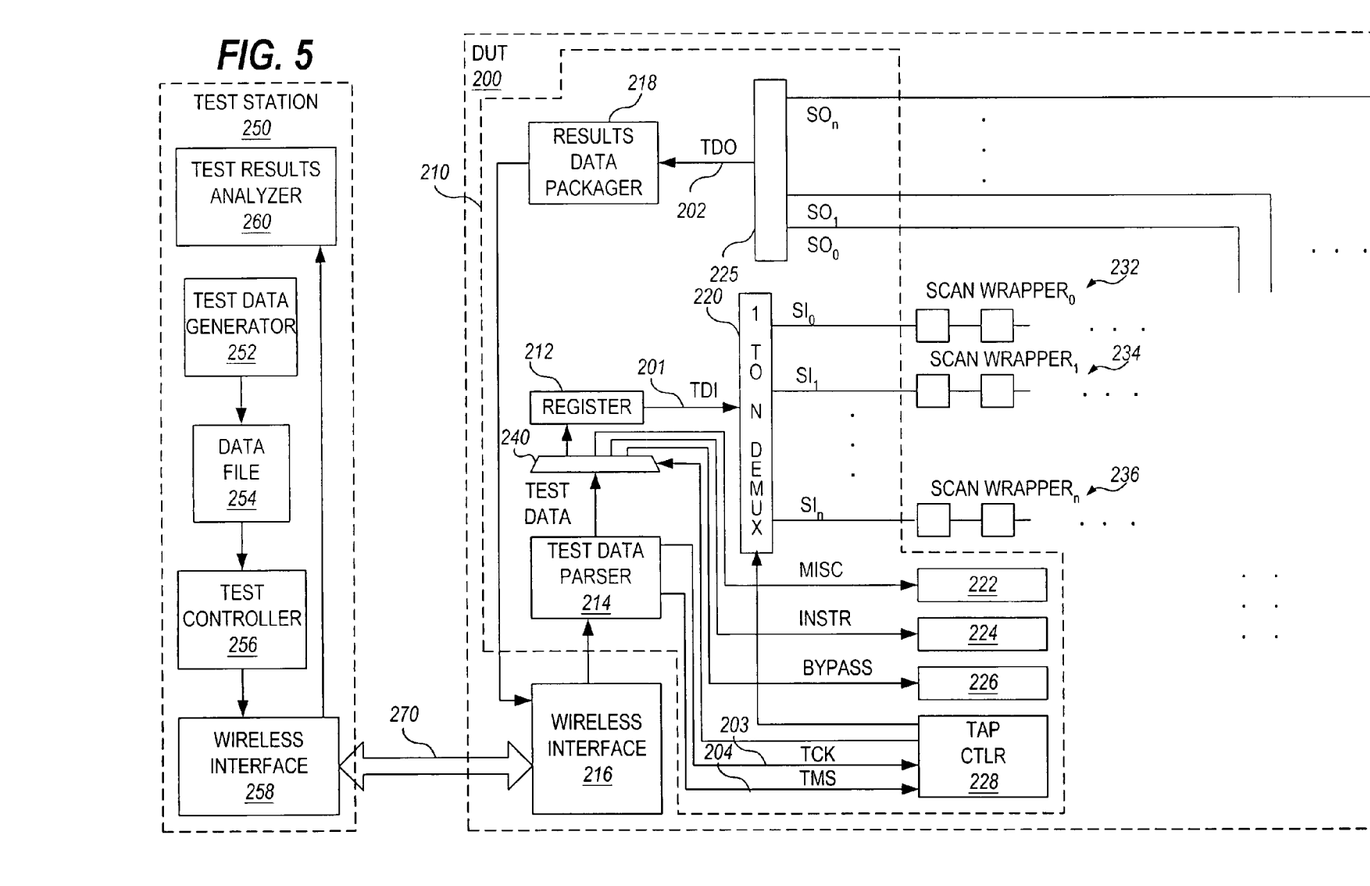
FIG. 5 is a schematic block diagram of a preferred embodiment of a DUT implemented in accordance with the invention.

FIG. 5 is a block diagram of an example implementation of a device under test (DUT) 200, for example an integrated circuit, implemented to allow wireless testing from a test station 250. As illustrated, the DUT 200 includes a TAM 210 implemented according to the standard IEEE 1149.1 architecture. Test instructions and test data are input to the DUT 200 via the TDI port 201. Test results and status information are returned from the DUT 200 via the TDO port 202. The TAM 210 includes a test access port (TAP) controller 228 that receives test clock (TCK) 203 and test mode select (TMS) 204 signal. The TAP controller 228 controls the interpretation of data received on the TDI port 201. The TAP controller 228 is a synchronous finite-state machine that is clocked by the TCK signal 203 and processes the TMS signal 204 to determine the operations of data flow through one or more of the instruction register 224, bypass register 226, miscellaneous register 222, and scan wrappers 232, 234, 236. The TMS signal 204 determines the operation of the TAM 210. Certain sequences of 0s and 1s place the TAM 210 in various modes such a normal mode (i.e., the normal operating mode of the chip where the DFT circuitry is transparent to the application logic of the integrated circuit), a scan mode (where the input of one more scan chains are connected to the TDI port 201 and the output of one or more scan chains 232, 234, 236 are connected to the TDO port 202), a capture mode (where data is serially loaded into one or more of the instruction register 224, the bypass register 226, miscellaneous register 222, or one or more of the scan chains 232, 234, 236), and an update mode (where the data stored in the scan storage cells of the scan chains 232, 234, 236 are output from the respective scan storage cell outputs).

In the embodiment of FIG. 5, a test station 250 configured with a wireless IP interface 258 preferably includes a test data generator 222 which generates test data 224. It will be appreciated, however, that the test data 254 may be generated by another source and delivered to the test station 250 for use in sending test data to the DUT 200 for testing. For example, certain functional cores (not shown) in the DUT 200 may be standard third-party cores that provide standard DFT structures and test data for testing the cores. In this case, the test data is generated by the third party and sent to the chip manufacturer as a data file 254 for use by the chip manufacturer in testing that particular functional core.

Turning back to the embodiment of FIG. 5, a test controller function 226 communicates with the wireless IP interface 228, which in the preferred embodiment, implements a TCP/IP stack according to the IEEE standard 801.11, incorporated herein by reference for all that it teaches. The wireless IP interface 228 transmits the test data 224 over a wireless TCP/IP connection 270 to a device under test 200.

At the DUT 200, the circuit includes a wireless IP core 216 that receives test data over a wireless connection 270.

The wireless IP core 216 performs all the functions of the data link layer, network layer, etc., and passes data frames to a test data parser 214. The test data parser 214 extracts the TCK signal 203 and TMS signal 204 and passes them to the TAP controller 228. The TCK signal 203 runs the TAP state machine, and the TMS signal 204 determines the state of the state machine. The test data parser 214 also extracts test data bytes, words, or blocks, which are passed, preferably in parallel, to a multiplexer 240 which is connected at an output to each of a scan-in register 212, instruction register 224, miscellaneous register 222, and bypass register 226. The TAP controller 228 controls the output of the multiplexer 240. The output of the register 212 is connected to the input of a 1-to-N demultiplexer, which passes the register contents on to a selected one of the scan input ports of Scan Wrappers 232, 234, 236, under the control of the TAP controller 228. Instructions, bypass data, or miscellaneous data is sent to one of either the TAM miscellaneous register 222, instruction register 224, bypass register 226. In this embodiment, test data is shifted serially into the selected register or scan wrapper, according to standard boundary scan convention. However, if the scan wrappers 232, 234, 236 support parallel load, the selected register or scan wrapper may be loaded from the register 212 in parallel.

The TAP controller 228 controls application of data from the scan storage cells of the respective scan wrappers 232, 234, 236 to the respective functional blocks (not shown in FIG. 5).

Test data results are shifted serially out from the Scan Wrappers 232, 234, 236 in sync with the test clock signal TCK 203. A test results data packager 218 assembles the test results data into frames and passes the frames on to the wireless interface 216, which in the preferred embodiment, implements a TCP/IP stack, and transmits the test results data over the wireless TCP/IP connection 270 to the test station 200.

At the test station, the wireless interface 258 receives the test results from the DUT 200, extracts the test results data, and preferably passes it on to a test results analyzer 230 for analysis. In the alternative, the test results data are stored for later analysis, or transmitted to another device for analysis.

The embodiment of FIG. 5 is implemented in accordance with the IEEE 1149.1 JTAG standard, with one TDI port 201 and one TDO port 202.

Figure 6:
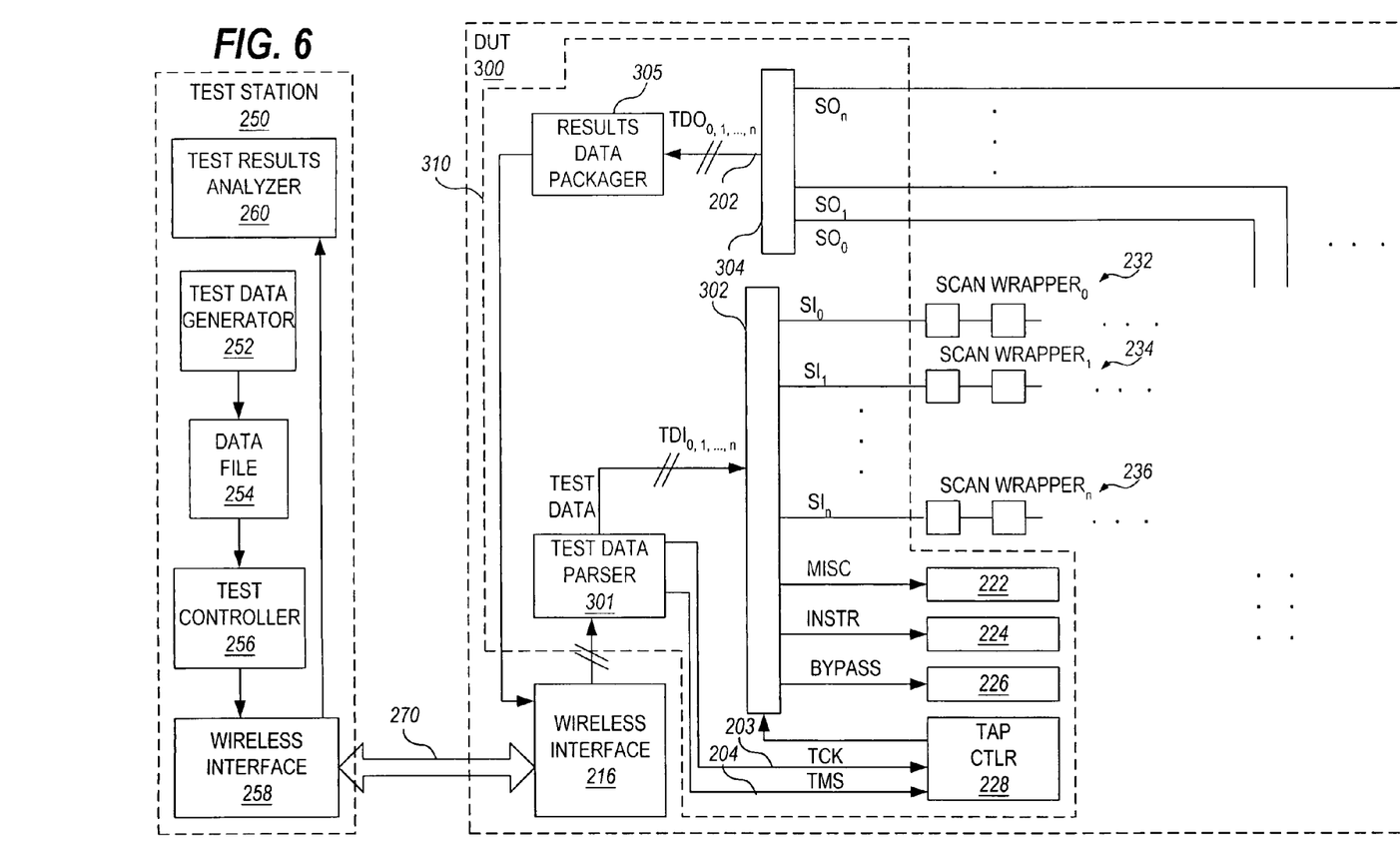
FIG. 6 is a schematic block diagram of an alternative embodiment of a DUT implemented in accordance with the invention.

FIG. 6 illustrates an alternative embodiment of a DUT 300 which essentially which implements multiple TDI ports and multiple TDO ports. The DUT 300 includes many of the same elements as the DUT 200 in the embodiment of FIG. 5, which are labeled in FIG. 6 with the same reference numbers as those in FIG. 5. In this embodiment, the parsed test data/instructions are input in parallel to a scan-in register 302 from a test data parser 301. Each bit (or few bits) in the scan-in register drives the input of a different scan wrapper 232, 234, 236 or TAM register 224, 222, 226. The TAM 228 controls output of the scan-in register 302 to feeding the scan wrapper 232, 234, 236 or TAM register 224, 222, 226 in parallel. Thus, the TAM 310 essentially implements a plurality of TDI ports, one each driving a separate scan chain 232, 234, 236, to allow concurrent testing of independently testable blocks (not shown) on the integrated circuit chip 300. In this embodiment, the TAM 228 is also implemented with a plurality of TDO ports, one each corresponding to a different bit in a TDO output register 304, where each bit is driven by the output of a separate scan chain 232, 234, 236. A results data packager 305 receives the test results from the TDO output register 304 in parallel, and formats them into frames to pass on to the wireless interface 216 for transmission to the test station 250.

From the above detailed description, it is clear that the present invention provides many advantages over the prior art. By implementing a wireless core and DFT structures within the integrated circuit, the invention allows test data to be downloaded to and test results returned from the integrated circuit with minimal external probing, for example as few as one power and one ground connection. Since external probing can be eliminated, this eliminates the need for expensive probe testers for testing the digital portions of the integrated circuit, reducing the requirements of the test station to a simple computer (such as a common personal computer or laptop) equipped with a wireless interface.

Additionally, since many wireless protocols support simultaneous communication with multiple devices, test data can be downloaded to multiple integrated circuits or devices simultaneously.

In addition, the present invention can support concurrent testing of independently testable function blocks within a given integrated circuit under test. In this regard, each bit of a byte, word, or block of test data can be implemented to drive a separate DFT structure within the integrated circuit to effect download of test data via multiple channels within the download of a single Internet protocol frame.

Parallel testing of multiple devices can be combined with CCT implementations to allow CCT of multiple blocks on multiple integrated circuits under test. To this end, referring back to FIGS. 2A and 2B, the station computer 2 initializes its own wireless IP interface 3. It then validates each of the remote DUTs 5*a*, 5*b*, . . . , 5*n*. Validation can be active, such as sending an instruction to each of the DUTs to connect to the DFT circuits 7*a*, 7*b*, . . . , 7*n*, and waiting for an acknowledge, or can be passive, by simply waiting for a signal from each of the DUTs. The test station 2 then establishes a communication channel with each of the DUTs 5*a*, 5*b*, . . . , 5*n*. The test station 2 then obtains test data. Test data may be stored locally in test station memory (not shown), or may be received from a remote device (not shown).

Finally, the present invention is especially applicable to testing the now proliferous wireless enabled ASICs. Since the wireless interface hardware is already present on these devices, the wireless core may be used as a digital test data conduit in place of expensive hardware-based tester resources. In combination with DFT and CCT techniques, the present invention can assist in bringing down the costs of integrated circuit testing.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, it should be understood that the term the wireless interface as used in both the specification and the claims includes any interface that implements a wireless communications protocol herein known or hereinafter developed. It is also possible that other benefits or uses of the currently disclosed invention will become apparent over time.

What is claimed is:

1. An integrated circuit comprising:
   one or more functional blocks to be tested when said integrated circuit is placed in a test mode;

one or more test structures configured to test said one or more functional blocks when said integrated circuit is placed in said test mode;

a wireless interface which receives test data over a wireless connection, the test data comprising a frame having a plurality of bits; and a test access mechanism which controls input of said received test data to said test structures, wherein at least two of said plurality of bits of the frame are applied to different respective test structures on said integrated circuit.

2. An integrated circuit in accordance with claim 1, wherein:

said wireless interface implements an Internet Protocol stack which extracts test data from, and transmits test results over, said wireless connection in formatted frames.

3. An integrated circuit in accordance with claim 1, wherein:

said test structures comprise one or more scan chains; and said test access mechanism comprises a scan chain loading mechanism.

4. An integrated circuit in accordance with claim 3, wherein:

said scan chain loading mechanism simultaneously loads a plurality of scan chains with different bits of the frame of said test data.

5. An integrated circuit in accordance with claim 3, wherein:

the different bits of the frame are loaded into the one or more scan chains in parallel.

6. A system for testing an integrated circuit, comprising:

a plurality of integrated circuits, each comprising:

one or more functional blocks to be tested when said integrated circuit is placed in a test mode;

one or more test structures configured to test said one or more functional blocks when said integrated circuit is placed in said test mode;

a wireless interface which receives and extracts test data from a wireless connection; and a test access mechanism which controls input of said received test data to said test structures; and a test station comprising a test station wireless interface which simultaneously transmits the test data over the wireless connection to the wireless interfaces of each of the plurality of integrated circuits.

7. A system in accordance with claim 6, wherein:

each of the wireless interfaces of the plurality of integrated circuits implements an Internet Protocol stack which extracts test data from, and transmits test results over, said wireless connection in formatted frames.

8. A system in accordance with claim 7, wherein:

said test data comprises a frame having a plurality of bits at least two of which are driven to respective different test structures on said respective one or more integrated circuits.

9. A system in accordance with claim 6, wherein:

said test structures on said respective plurality of integrated circuits comprise one or more scan chains; and said test access mechanism on said respective plurality of integrated circuits comprises a scan chain loading mechanism.

10. A system in accordance with claim 9, wherein:

said scan chain loading mechanism on each of said respective plurality of integrated circuits simultaneously loads a plurality of scan chains.

11. A system in accordance with claim 9, wherein:

said scan chain loading mechanism on each of said respective plurality of integrated circuits loads one or more scan chains in parallel.

12. A method for testing integrated circuits comprising:

obtaining test data;

simultaneously sending said test data via a wireless interface over a wireless connection to a plurality of integrated circuit devices under test, each comprising one or more functional blocks to be tested when said respective integrated circuit device under test is placed in a test mode, one or more test structures configured to test said one or more functional blocks when said respective integrated circuit device under test is placed in said test mode, a wireless interface which receives and extracts said test data from said wireless connection; and a test access mechanism which controls input of said received test data to said test structures of said respective integrated circuit device under test.

13. A method in accordance with claim 12, comprising:

receiving test results via said wireless interface from said wireless connection from said plurality of integrated circuit devices under test, said test results returned from said one or more test structures of said respective plurality of integrated circuit devices under test from application of said test data to said one or more functional blocks of said respective pl of integrated circuit devices under test.

* * * * *